(12) United States Patent
Iwabuchi et al.

(10) Patent No.: US 6,982,473 B2
(45) Date of Patent: Jan. 3, 2006

(54) BIPOLAR TRANSISTOR

(75) Inventors: Akio Iwabuchi, Saitama (JP); Shigeru Matsumoto, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/914,329

(22) Filed: Aug. 9, 2004

(65) Prior Publication Data

US 2005/0040431 A1   Feb. 24, 2005

(30) Foreign Application Priority Data

Aug. 20, 2003  (JP) ............................ 2003-296848

(51) Int. Cl.
    H01L 27/082   (2006.01)
    H01L 27/102   (2006.01)
    H01L 29/70    (2006.01)
    H01L 31/11    (2006.01)

(52) U.S. Cl. ........................ 257/565; 257/575; 257/557

(58) Field of Classification Search ................ 257/557, 257/575, 556, 565, 197

See application file for complete search history.

(56) References Cited

U.S. PATENT DOCUMENTS

2004/0173875 A1 *  9/2004  Yamamoto et al. ......... 257/565

FOREIGN PATENT DOCUMENTS

JP          H10-270458         10/1998

* cited by examiner

*Primary Examiner*—Phat X. Cao
(74) *Attorney, Agent, or Firm*—Howard & Howard

(57) ABSTRACT

At a surface region of an N$^-$-type base region, surrounded by a P-type isolation region, a P$^+$-type collector region, a P$^+$-type emitter region, an N$^+$-type base contact region, and an N-type rectifying region are formed. The N-type rectifying region straddles over the emitter region and the base contact region. The rectifying region has an impurity concentration higher than that of the base region, and lower than that of the base contact region. The forward voltage at the interface of the rectifying region and the emitter region is higher than the forward voltage at the interface of the base region and the emitter region. Therefore, the current from the emitter region flows to the collector region, and does not flow that much to the isolation region. By this, leakage current is small. Also, because the collector region does not surround the emitter region, the element size is small.

9 Claims, 10 Drawing Sheets

US 6,982,473 B2

BIPOLAR TRANSISTOR

RELATED APPLICATIONS

This application claims priority to Japanese Application No. 2003-296848 filed Aug. 20, 2003.

BACKGROUND OF THE INVENTION

1. Field of the Invention

The present invention relates to a semiconductor element that has a lateral structure, and especially to a semiconductor element, which is small in size, that has a lateral structure.

2. Description of the Related Art

In an analog integrated circuit, a lateral PNP transistor that has a structure where an emitter region, a collector region, and a base region are formed adjacent in a horizontal direction, is used. As shown in the plane view in FIG. 7, the semiconductor element used in the lateral PNP transistor is constituted by an $N^-$-type base region 33, a $P^+$-type collector region 34, a $P^+$-type emitter region 35, an $N^+$-type base contact region 36, and a $P^+$-type isolation region 38. When a current is passed through a semiconductor element (transistor) that has this kind of structure, the current from the emitter region 35 not only flows towards the collector region 34, but as shown by arrows YB, also flows towards the base contact region 36 and the isolation region 38. By such diffusion of current, a leakage current generates at the operation time of the transistor. As a result, the current amplification factor of the transistor drops. So, in order to prevent the leakage current from generating, a lateral PNP transistor where the vicinity of the emitter region 35 is surrounded by the collector region 34 is proposed. This kind of lateral PNP transistor is disclosed in for example, FIG. 1 of Unexamined Japanese Patent Application KOKAI Publication No. H10-270458.

FIG. 8 is a plane view of a semiconductor element that has a structure where a collector region surrounds an emitter region. FIG. 9 is a cross-sectional view in line C–C' in FIG. 8. As shown in FIGS. 8 and 9, a collector region 44 is formed so as to surround an emitter region 45, separated a predetermined distance from the emitter region 45. Therefore, as shown by arrows YC, most of the current that flows from the emitter region 45, flows to the collector region 44. By this, generation of the leakage current at the operation time of the transistor, is prevented.

However, because the collector region 44 is formed so as to surround the emitter region 45, the area of the collector region 44 inevitably becomes larger. Accompanying this, the area of the entire semiconductor element also becomes larger. Consequently, making the size of the semiconductor element smaller, is considered by narrowing the interval $W_B$ (base width $W_B$) between the collector region 44 and the emitter region 45. To maintain the high withstand voltage of the transistor, the base width $W_B$ must be kept equal to or wider than a certain width. Therefore, there is a limit in miniaturizing the size of the semiconductor element. Consequently, it is difficult to obtain a semiconductor element of a requested size, with a semiconductor element having a structure where the collector region 44 surrounds the emitter region 45.

The content of the above document is incorporate herein by reference in their entirety.

SUMMARY OF THE INVENTION

The present invention has been made in consideration of the above, and an object is to realize a semiconductor element having a lateral structure, that suppresses leakage current, and has a small size.

To achieve the above object, a semiconductor element according to a first aspect of the present invention comprises:

a first semiconductor region of a first conductivity type;

a second semiconductor region of a second conductivity type that contacts a side surface of the first semiconductor region, and is formed so as to surround the first semiconductor region;

a third semiconductor region of the second conductivity type that is formed at a surface region of the first semiconductor region;

a fourth semiconductor region of the first conductivity type that is formed at the surface region of the first semiconductor region, respectively separated a predetermined distance from the third semiconductor region, and has a higher impurity concentration than the impurity concentration of the first semiconductor region;

a fifth semiconductor region of a second conductivity type that is formed at the surface region of the first semiconductor region, and is placed in between the third semiconductor region and the fourth semiconductor region, separated a predetermined distance from the third semiconductor region and the fourth semiconductor region;

a sixth semiconductor region of the first conductivity type, having a higher impurity concentration than the impurity concentration of the first semiconductor region, that is formed at the surface region of the first semiconductor region, includes a region in between the fourth semiconductor region and the fifth semiconductor region, and is placed so as to contact the fifth semiconductor region;

a first electrode that is electrically connected to the third semiconductor region;

a second electrode that is electrically connected to the fourth semiconductor region, and a third electrode that is electrically connected to the fifth semiconductor region.

According to this structure, the sixth semiconductor region that has a high impurity concentration, is formed in between the fourth semiconductor region and the fifth semiconductor region. Therefore, forward voltage at the contact surface of the fifth semiconductor region and the sixth semiconductor region is large. Consequently, when a voltage is applied to the first to third electrodes, most of the current that flows from fifth semiconductor region does not flow to the sixth semiconductor region, but to the third semiconductor region.

The sixth semiconductor region may be formed deeper than the fourth semiconductor region and the fifth semiconductor region. Also, the sixth semiconductor region may be formed so as to straddle over the fourth semiconductor region and the fifth semiconductor region.

According to this structure, it is possible to pass more of the current that flows from the bottom part of the fifth semiconductor region to the third semiconductor region.

The sixth semiconductor region may be formed so as to cover a surface of the fifth semiconductor region that opposes the fourth semiconductor region. Further, the semiconductor region may be formed so as to cover at least a part of a surface of the fifth semiconductor region that opposes the second semiconductor region.

According to this structure, it is possible to pass more of the current that flows to a horizontal direction from the fifth semiconductor region to the third semiconductor region.

The sixth semiconductor region may have a lower impurity concentration than the impurity concentration of the fourth semiconductor region. The impurity concentration of the sixth semiconductor region may be in a range of 1.5 to 10 times the impurity concentration of the first semiconductor region.

According to this structure, an adequate relationship of impurity concentration between the first semiconductor region, the fourth semiconductor region, and the sixth semiconductor region, for passing the current that flows from the fifth semiconductor region to the third semiconductor region, can be achieved.

The semiconductor element may further comprise a semiconductor substrate of the second conductivity type, wherein the first semiconductor region and the second semiconductor region are formed on one surface of the semiconductor substrate.

According to this structure, the first semiconductor region is surrounded by the semiconductor substrate of a second conductivity type, and the second semiconductor region. By this, the semiconductor and adjacent semiconductor elements can be almost completely insulated.

The first electrode may be a collector electrode, the second electrode may be a base electrode, the third electrode may be an emitter electrode, the third semiconductor region may function as a collector region, the first semiconductor region and the fourth semiconductor region may function as base regions, and the fifth semiconductor region may function as an emitter region.

By this structure, the semiconductor element of the present invention can be operated as a transistor.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A semiconductor element according to an embodiment of the present invention will be described with reference to the drawings.

Figure 1:
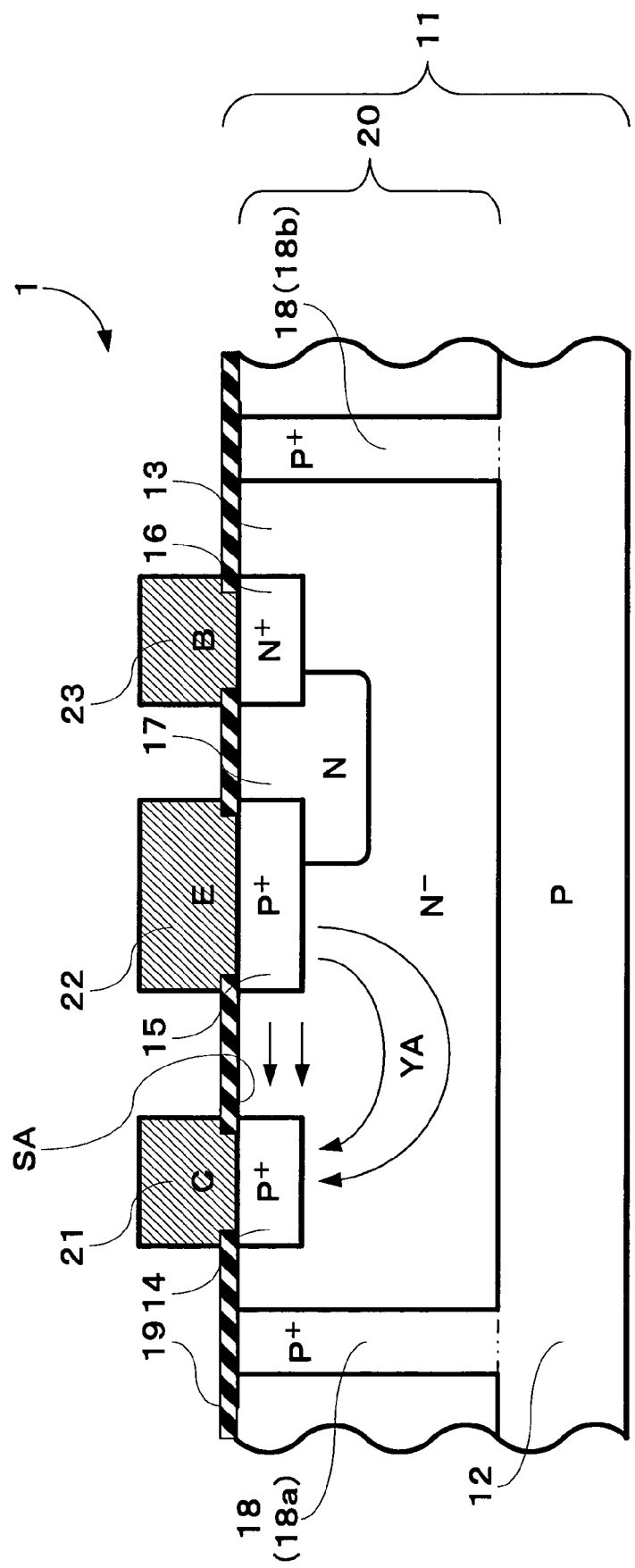
FIG. 1 is a cross-sectional view of a semiconductor element according to an embodiment of the present invention.
Figure 2:
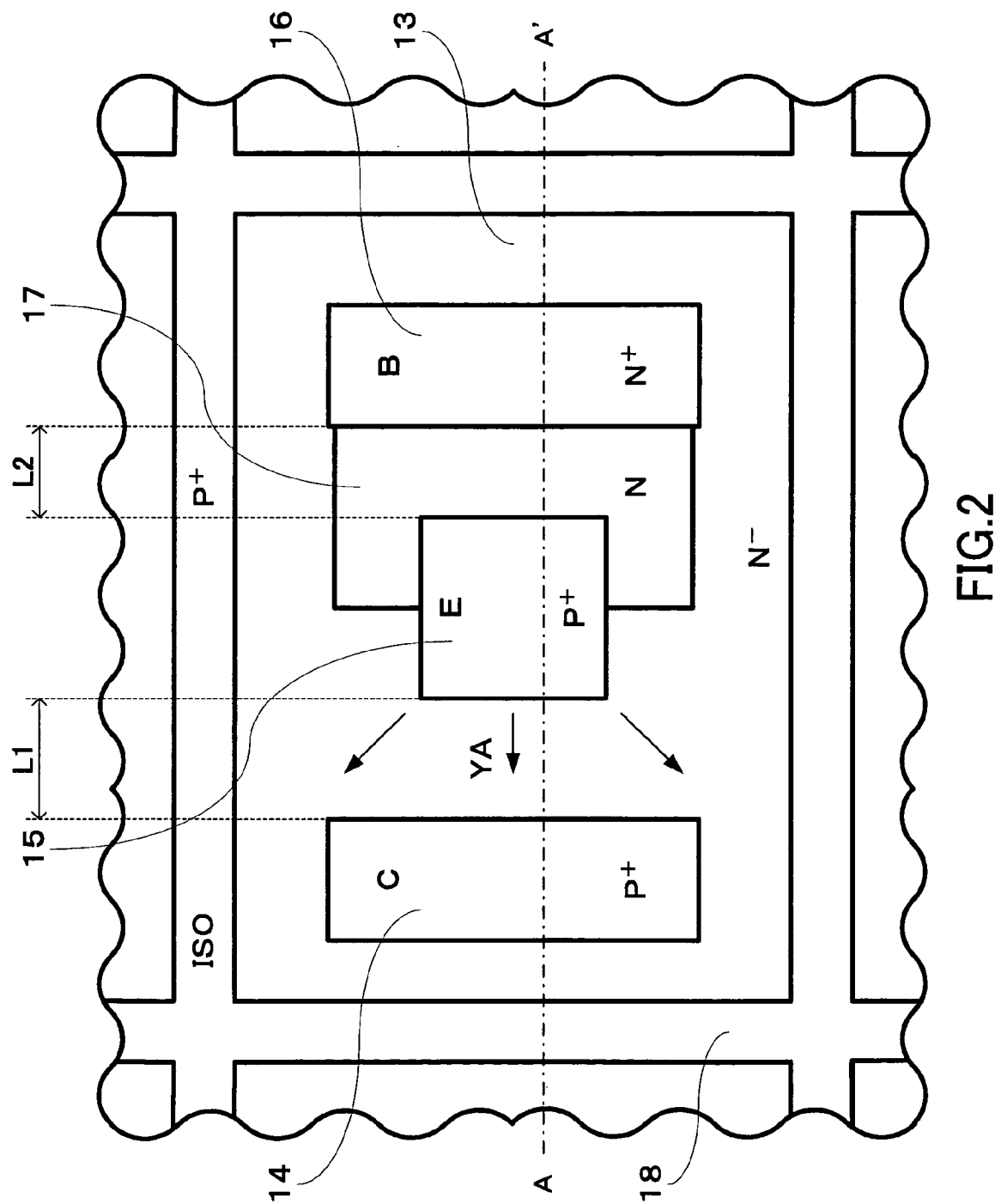
FIG. 2 is a plane view showing one main surface of the semiconductor element according to the embodiment of the present invention.

FIG. 1 is a cross-sectional view of a semiconductor element 1, according to the present embodiment. FIG. 2 is a plane view of the semiconductor element 1. FIG. 1 is a cross-sectional view of the semiconductor element 1 in line A–A', in FIG. 2.

As shown in FIGS. 1 and 2, the semiconductor element 1 comprises a semiconductor base 11, a collector electrode 21, an emitter electrode 22, and a base electrode 23. The collector electrode 21, the emitter electrode 22, and the base electrode 23 are omitted in FIG. 2.

The semiconductor base 11 is constituted by a P-type semiconductor substrate 12, an N-type semiconductor layer 20 formed on the P-type semiconductor substrate 12, and an insulating film 19 provided on the N-type semiconductor layer 20.

The P-type semiconductor substrate 12 is formed by diffusing a P-type impurity (for example, boron) to a silicon single crystal substrate.

The N-type semiconductor layer 20 is formed by epitaxial growing the N-type semiconductor layer on the P-type semiconductor substrate 12. The N-type semiconductor layer 20 includes a base region 13, a collector region 14, an emitter region 15, a base contact region 16, a rectifying region 17, and an isolation region 18.

Of the N-type semiconductor layer 20, the base region 13 is an island shaped region that is divided by the isolation region 18. The conductivity type of the base region 13 is an N-type. At the surface region of the base region 13, the collector region 14, the emitter region 15, the base contact region 16, and the rectifying region 17 are formed.

The collector region 14 is formed in an approximately rectangular shape, at the surface region of the base region 13. The conductivity type of the collector region 14 is a P-type. The collector region 14 has a higher impurity concentration than that of the base region 13.

The emitter region 15 is formed at the surface region of the base region 13. The conductivity type of the emitter region 15 is a P-type. The emitter region 15 has a higher impurity concentration than that of the base region 13, and is formed in a position that is separated a predetermined distance from the collector region 14.

The base contact region 16 is formed at the surface region of the base region 13. The conductivity type of the base contact region 16 is an N-type. The base contact region 16 has a higher impurity concentration than that of the base region 13. The base contact region 16 is formed so as to oppose the collector region 14, via sandwiching the emitter region 15, in a position that is separated a predetermined distance from the emitter region 15. To retain the high withstand voltage of the semiconductor element 1 (transistor), it is preferable that a distance L1 between the collector region 14 and the emitter region 15, is longer than a distance L2 between the base contact region 16 and the emitter region 15.

The rectifying region 17 is formed at the surface region of the base region 13, so as to straddle over the emitter region 15 and the base contact region 16. Namely, the rectifying region 17 includes the region in between the emitter region 15 and the base contact region 16. The conductivity type of the rectifying region 17 is an N-type. The rectifying region 17 has a higher impurity concentration than that of the base region 13, and has a lower impurity concentration than that of the emitter region 15 and the base contact region 16.

The isolation region 18 is formed on the P-type semiconductor substrate 12, so as to surround the base region 13. The conductivity type of the isolation region 18 is a P-type. The electric potential of the isolation region 18 is maintained constant. By this, the isolation region 18 has a function for electrically separating a plurality of elements.

The insulating film 19 is constituted by a silicon oxide film, etc. The insulating film 19 covers one main surface SA of the semiconductor base 11, and electrically separates the collector electrode 21, the emitter electrode 22, and the base electrode 23 from each other. The insulating film 19 has contact holes that are formed on the collector region 14, the emitter region 15, and the base contact region 16.

The collector electrode 21 is formed on the collector region 14, and is electrically connected to the collector region 14, via the contact hole formed at the insulating film 19. The emitter electrode 22 is formed on the emitter region 15, and is electrically connected to the emitter region 15, via the contact hole formed at the insulating film 19. The base electrode 23 is formed on the base contact region 16, and is electrically connected to the base contact region 16, via the contact hole formed at the insulating film 19. The collector electrode 21, the emitter electrode 22, and the base electrode 23 are constituted by metal, such as aluminum, copper, and nickel, etc.

The semiconductor element 1 that has the above structure, operates as a transistor, by applying a predetermined voltage to the collector electrode 21, the emitter electrode 22, and the base electrode 23. At this time, a difference occurs in the way a current flows, between the surface that the emitter region 15 and the base region 13 contact, and the surface that the emitter region 15 and the rectifying region 17 contact. In detail, because the impurity concentration of the base region 13 is lower than the impurity concentration of the rectifying region 17, the forward voltage at the surface that the emitter region 15 and the base region 13 contact is smaller than the forward voltage at the surface that the emitter region 15 and the rectifying region 17 contact. Therefore, the current that flows out of the emitter region 15 is unlikely to flow to the rectifying region 17, and most of the current flows to the base region 13. Namely, as shown by the arrows YA in FIG. 1 and FIG. 2, the current flows towards the collector region 14. By this, generation of the leakage current described in the section of Description of the Related Art, is suppressed. As a result, the decrease in current-amplification factor of the transistor, which is caused by the leakage current, can be prevented.

Figure 3A:
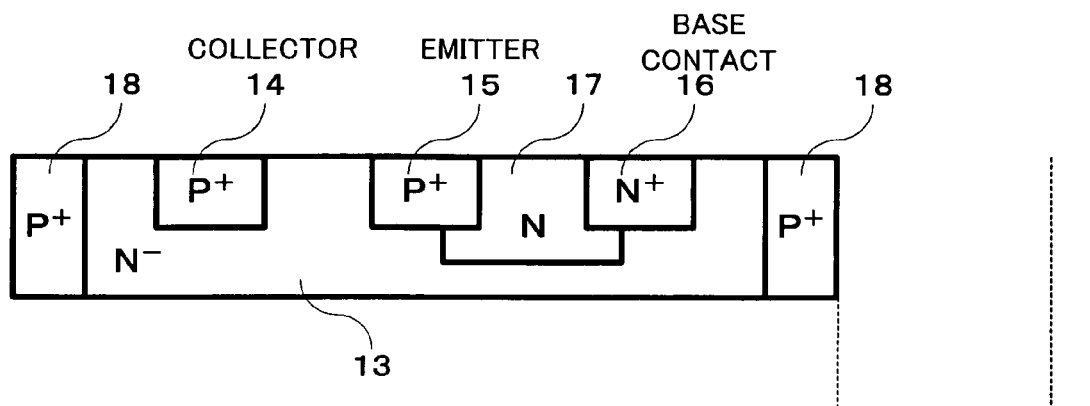
FIG. 3 is a cross-sectional view schematically showing that the width of the semiconductor element according to the embodiment of the present invention is reduced, compared to the conventional semiconductor element.
Figure 3B:
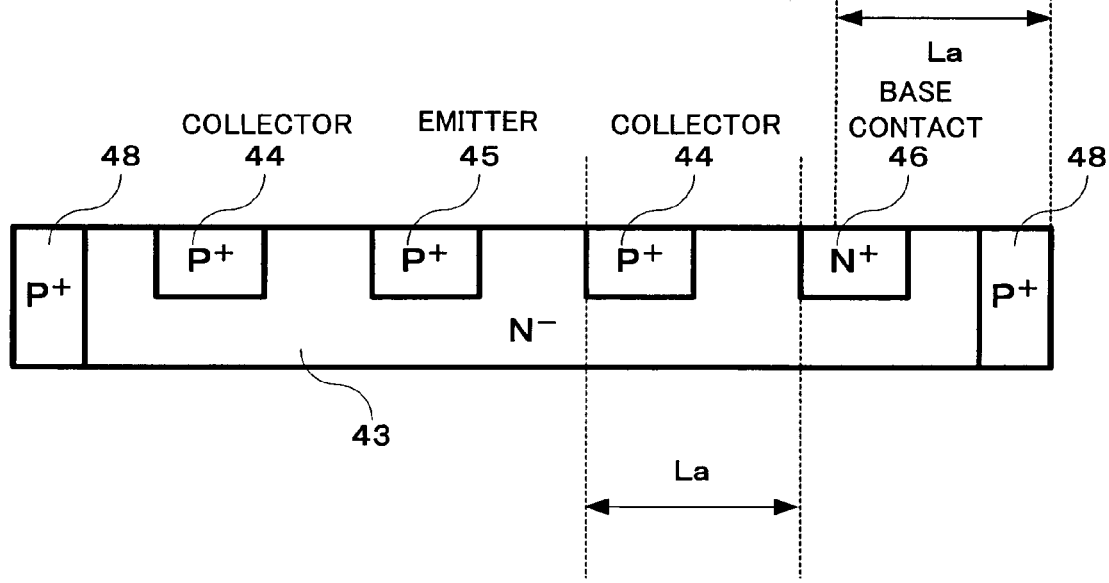

Also, because the collector region 14 has an approximately rectangular shape, the area of the semiconductor element 1 can be kept smaller than in the case of the collector region 14 surrounding the emitter region 15. Even if the distance L1 between the collector region 14 and the emitter region 15 is set longer than the distance L2 between the base contact region 16 and the emitter region 15, so as to retain the high withstand voltage of the transistor, the increase of the area of the semiconductor element 1 can be suppressed, because the collector region 14 does not surround the emitter region 15. FIGS. 3A and 3B are simplified cross-sectional views showing the structure of the semiconductor element 1 that applied the present invention, and the structure of a conventional semiconductor element. As shown in FIGS. 3A and 3B, in the semiconductor element applying the present invention, an La (sum of the width of the collector region 44 and the width between the collector region 44 and the base contact region 46) that existed by the collector region 44 surrounding the emitter region 45, does not exist. Namely, in a case where the present invention is applied, the entire area of the semiconductor element 1 becomes smaller than that of the conventional semiconductor element, and by this, it is possible to keep the size of the integrated circuit, which is constituted by the semiconductor element 1, small. In this way, according to the present invention, a semiconductor element having a lateral structure, that suppresses the generation of the leakage current, and is small in size, can be realized.

Next, a manufacturing method of the semiconductor element according to the embodiment of the present invention, will be described with reference to FIGS. 4A to 4E.

Figure 4A:
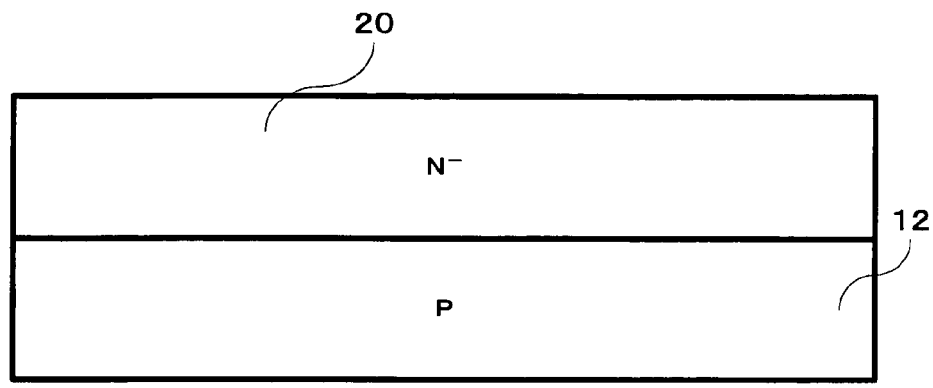
FIG. 4 is a cross-sectional view for describing a manufacturing method of the semiconductor element according to the embodiment of the present invention.

First, by introducing a P-type impurity to a silicon single crystal substrate, and diffusing it, a P-type semiconductor substrate 12 is formed. Next, as shown in FIG. 4A, an N-type semiconductor layer 20 is formed on one main surface of the P-type semiconductor substrate 12, by using the epitaxial growth method.

Figure 4B:
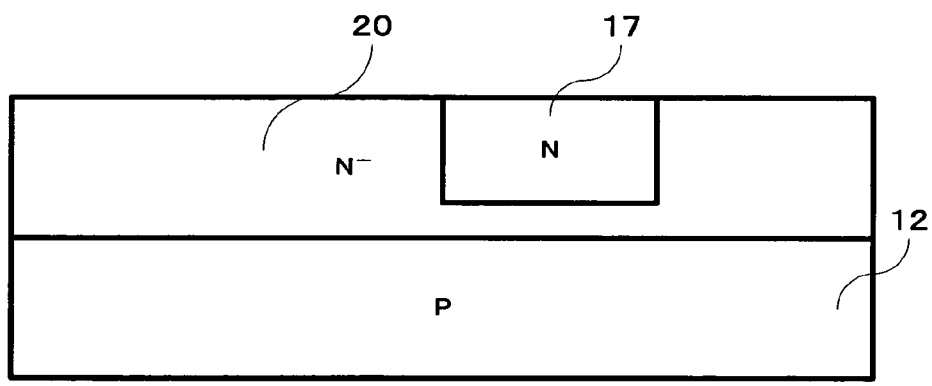

Sequentially, a not-shown resist film is formed on one surface of the N-type semiconductor layer 20. Of the formed resist film, a portion corresponding to a forming region of a rectifying region 17, is selectively removed by etching. By this, an opening is formed on the forming region of the rectifying region 17. Via the opening, an N-type impurity (for example, phosphorus) is implanted to a predetermined depth from the surface of the N-type semiconductor layer 20, by the ion implantation method. By this, as shown in FIG. 4B, the rectifying region 17 is formed.

Figure 4C:
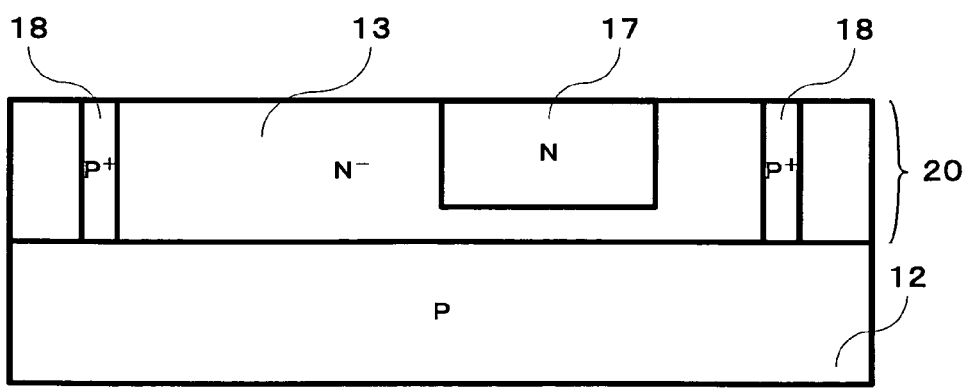

Next, one surface of the N-type semiconductor layer 20 is re-coated by a resist film. Of the resist film, a portion corresponding to a forming region of an isolation region 18, is selectively removed by etching. By this, an opening is formed on the forming region of the isolation region 18. Via the opening, a P-type impurity (for example, boron) is implanted to a predetermined depth from the surface of the N-type semiconductor layer 20, and diffused. By this, as shown in FIG. 4C, a P-type isolation region 18 is formed. Of the N-type semiconductor layer 20, the island shaped region that is separated by the isolation region 18, becomes a base region 13.

Figure 4D:
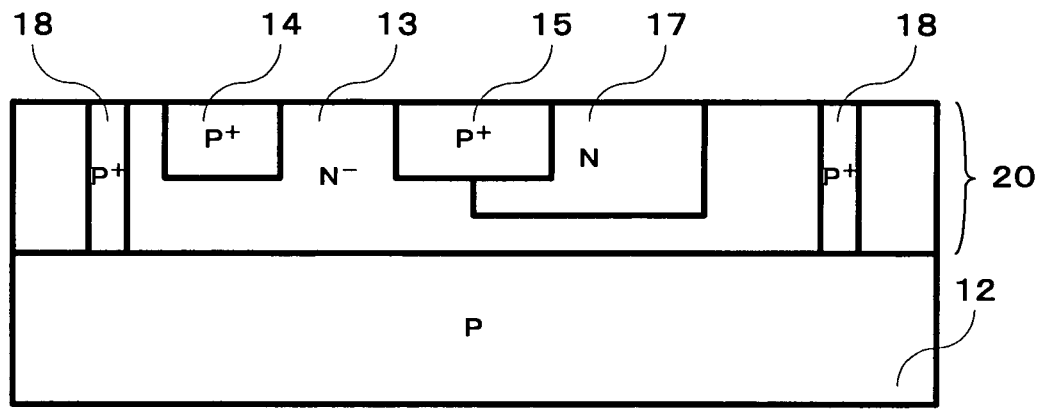

In the same way, a resist film is re-formed on one surface the N-type semiconductor layer 20. Of the resist film, portions corresponding to forming regions of a collector region 14 and an emitter region 15, are selectively removed by etching. By this, openings are formed on the forming regions of the collector region 14 and the emitter region 15. Via the openings, a P-type impurity (for example, boron) is implanted to a predetermined depth from the surface of the N-type semiconductor layer 20, and diffused. By this, as shown in FIG. 4D, the collector region 14 and the emitter region 15 are formed.

Figure 4E:
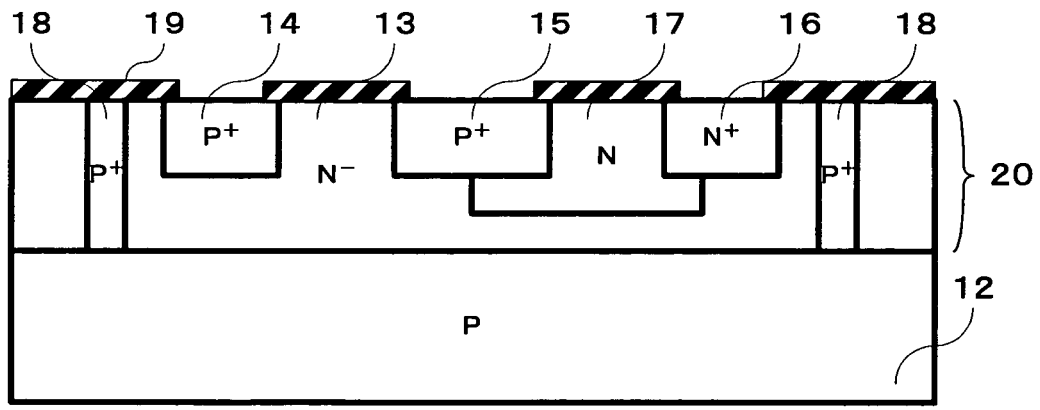

Next, a resist film is re-formed on one surface of the N-type semiconductor layer 20. Of the resist film, a portion corresponding to a forming region of the base contact region 16, is selectively removed by etching. By this, an opening is formed on the forming region of the base contact region 16. Via the opening, an N-type impurity (for example, phosphorus) is implanted to a predetermined depth from the surface of the N-type semiconductor layer 20, and diffused. By this, as shown in FIG. 4E, the base contact region 16 is formed.

After the resist film is removed, the surface of the N-type semiconductor layer 20 is covered by an insulating film 19. Then, as shown in FIG. 4E, contact holes for an emitter, a base, and a collector are formed in predetermined regions of the insulating film 19, by for example etching.

Sequentially, a metal (aluminum, copper, or nickel, etc.) film is formed by vacuum evaporation, on the insulating film 19. Then, by selectively patterning the formed metal film, as described above, the collector electrode 21 that contacts the collector region 14 via the contact hole, the emitter electrode 22 that contacts the emitter region 15 via the contact hole, and the base electrode 23 that contacts the base contact region 16 via the contact hole, are formed. By the above steps, the semiconductor element 1 according to the present embodiment, is formed.

By the above manufacturing method, the N-type semiconductor layer 20 is formed by epitaxial growth. By this, the base region 13 has a relatively uniform distribution of impurity concentration. Because the rectifying region 17 is formed by the ion implantation method, the depth of the rectifying region 17 can be easily controlled. By this, the rectifying region 17 of a requested depth can be easily obtained.

The present invention is not limited to the above embodiment, and various changes and modifications are possible.

For example, in the above embodiment, the rectifying region 17 is formed deeper than the emitter region 15 and the base contact region 16. However, the depth and size of the rectifying region 17 are arbitrary. For example, the rectifying region 17, the emitter region 15 and the base contact region 16 may be formed so that they have approximately equal depths.

Figure 5A:
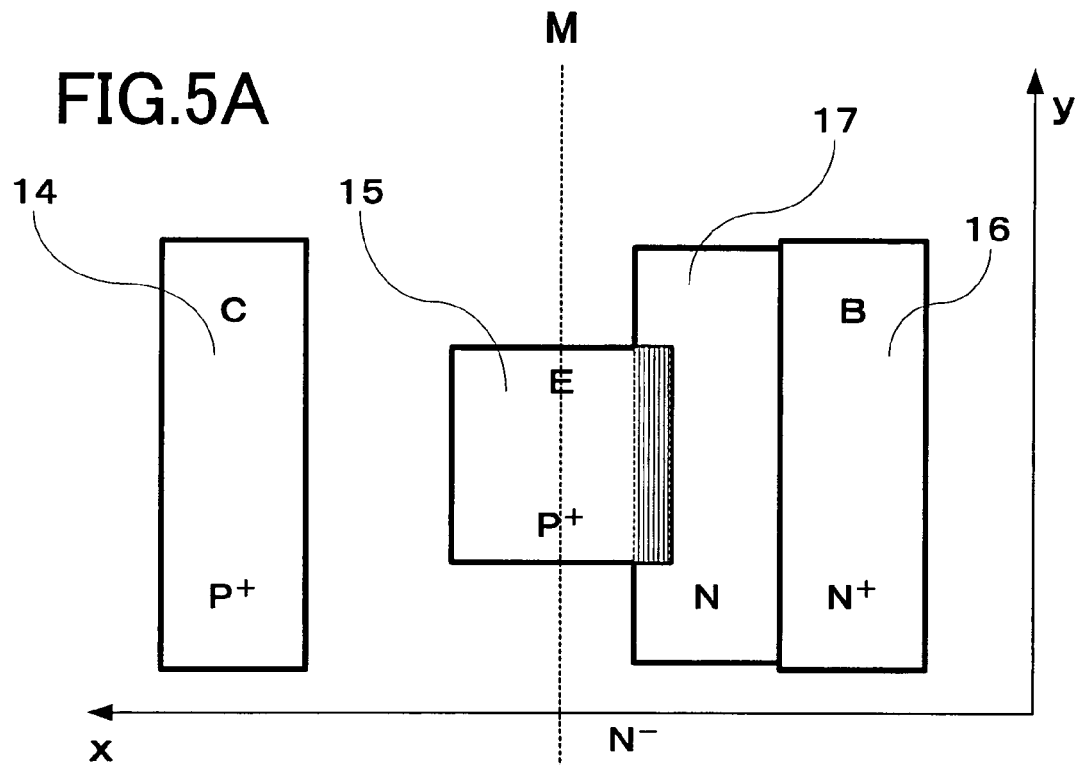
FIG. 5 is a diagram for describing the size of a rectifying region in the embodiment of the present invention, based on the positional relationship with the emitter region.
Figure 5B:
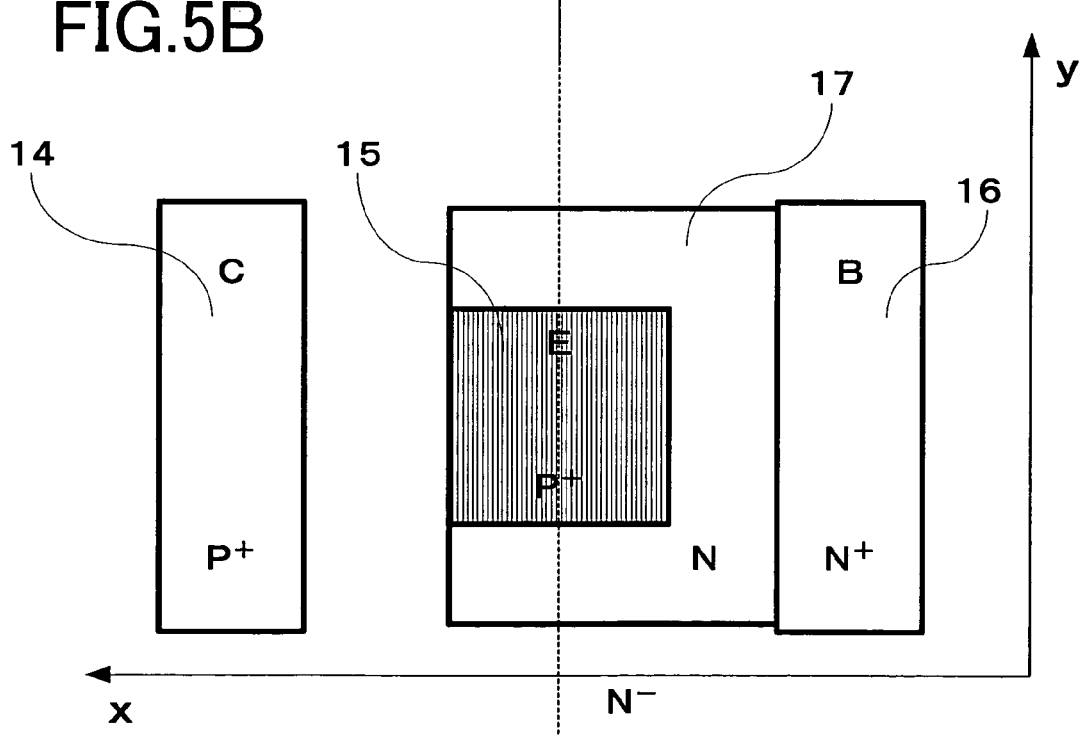

In the semiconductor element 1 of the above embodiment, the degree that the rectifying region 17 straddles over the emitter region 15 and the base contact region 16 is arbitrary. For example, in FIG. 1 and FIG. 2, an example where approximately half of the emitter region 15 and approximately half of the base contact 16 overlap with the rectifying region 17, is shown. However, as shown in FIG. 5A and FIG. 5B, the area of the region that overlaps, is arbitrary. For example, a structure where the emitter region 15 and the base contact region 16 do not overlap with the rectifying region 17, the rectifying region 17 and the emitter region 15 contact at side surfaces opposing each other, and the rectifying region 17 and the base contact region 16 contact at side surfaces opposing each other, is possible.

However, it is preferable that the rectifying region 17 straddles over the emitter region 15 to a certain extent. Furthermore, it is preferable that the area of the region that the rectifying region 17 and the emitter region 15 overlap, occupies equal to or more than half of the area of the emitter region 15. In other words, it is preferable that in FIG. 5A and FIG. 5B, the rectifying region 17 is formed so that its surface opposing the collector region 14 reaches a center line M of the emitter region 15. Also, on the contrary, it is preferable that the rectifying region 17 is formed so that its surface opposing the collector region 14 does not exceed the surface that opposes the collector region 14 of the emitter region 15, in the x direction in FIG. 5A and FIG. 5B.

It is preferable that the emitter region 15 is formed so that the width of the emitter region 15 in the y direction in FIG. 5A or FIG. 5B is narrower than the width of the collector region 14 in the y direction.

Figure 6:
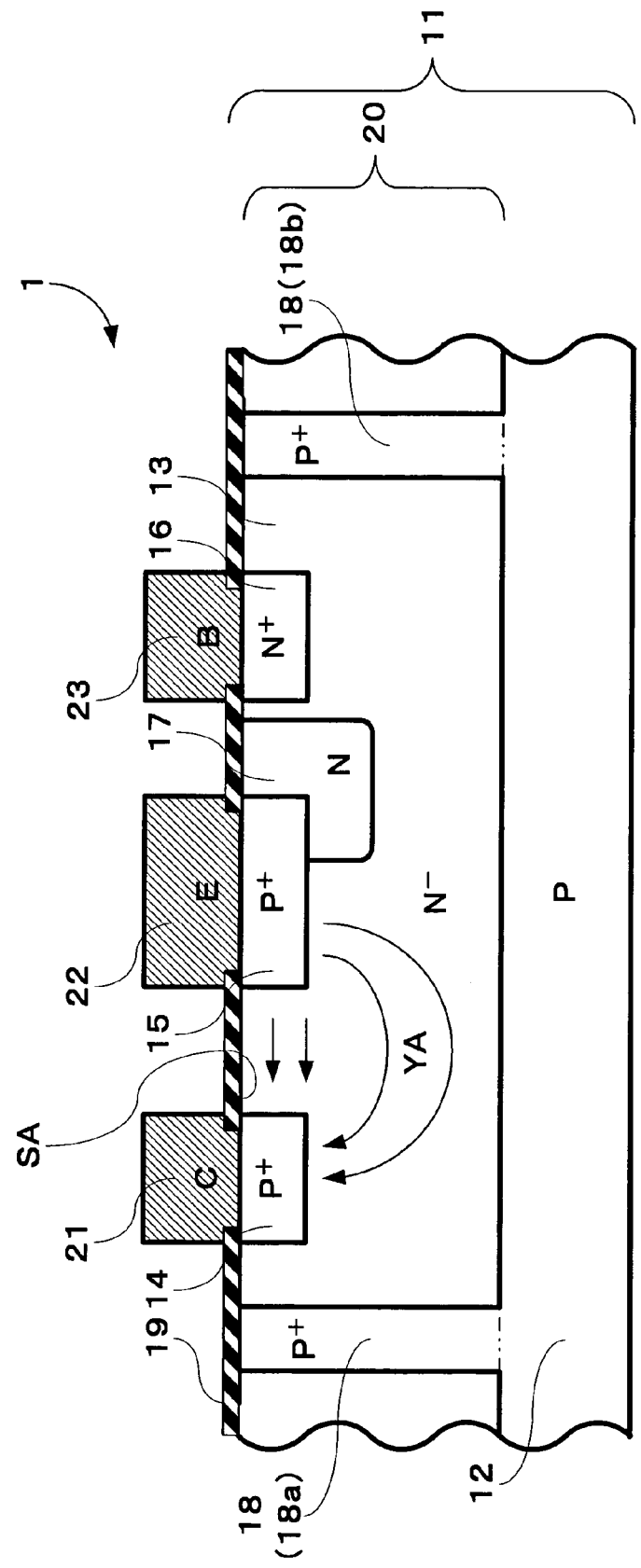
FIG. 6 is a cross-sectional view of a semiconductor element according to another embodiment of the present invention.
Figure 7:
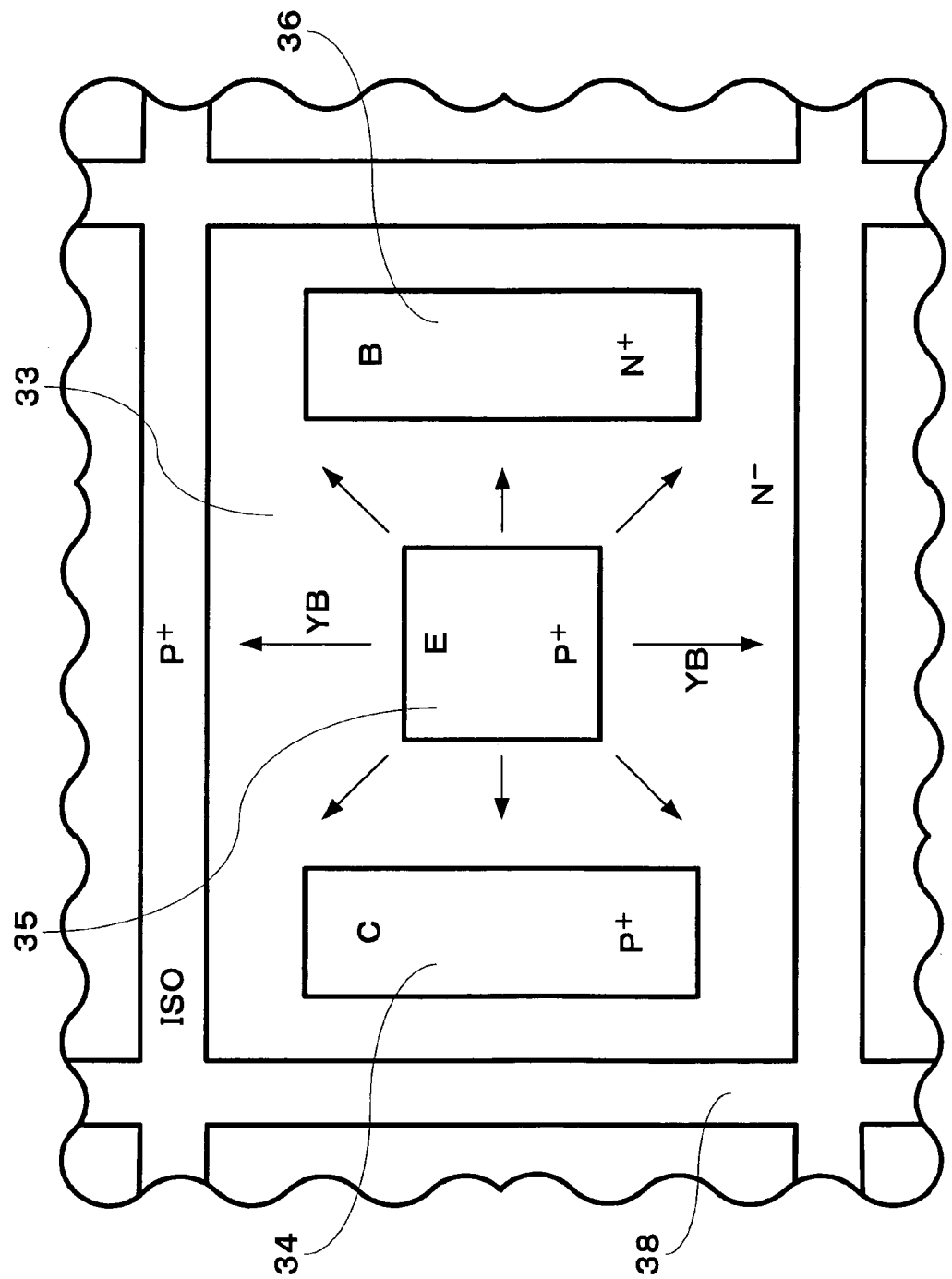
FIG. 7 is a plane view showing one main surface of a conventional semiconductor element that has a lateral structure.
Figure 8:
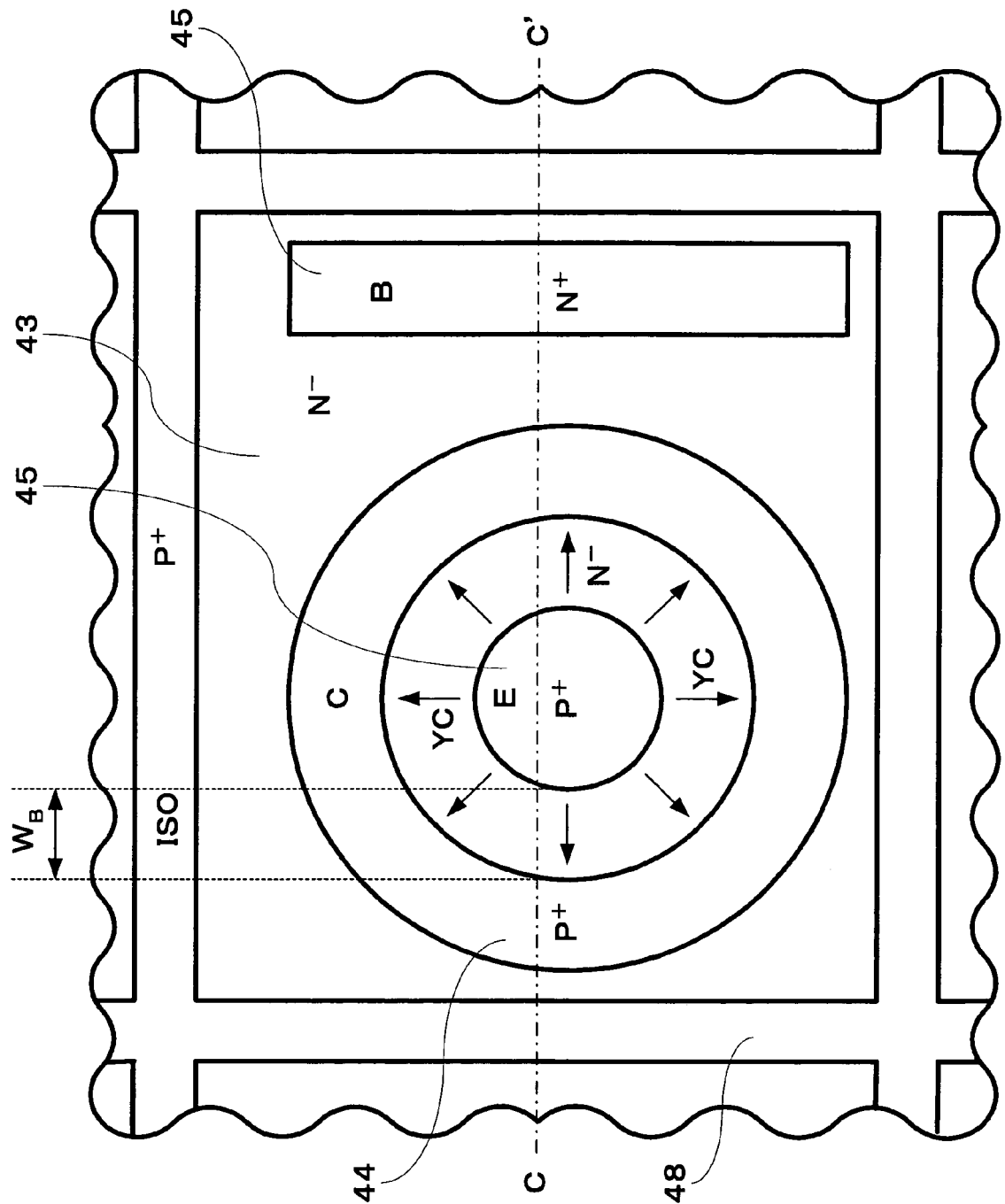
FIG. 8 is a plane view showing one main surface of a conventional semiconductor element that has a structure where the collector region surrounds the emitter region.
Figure 9:
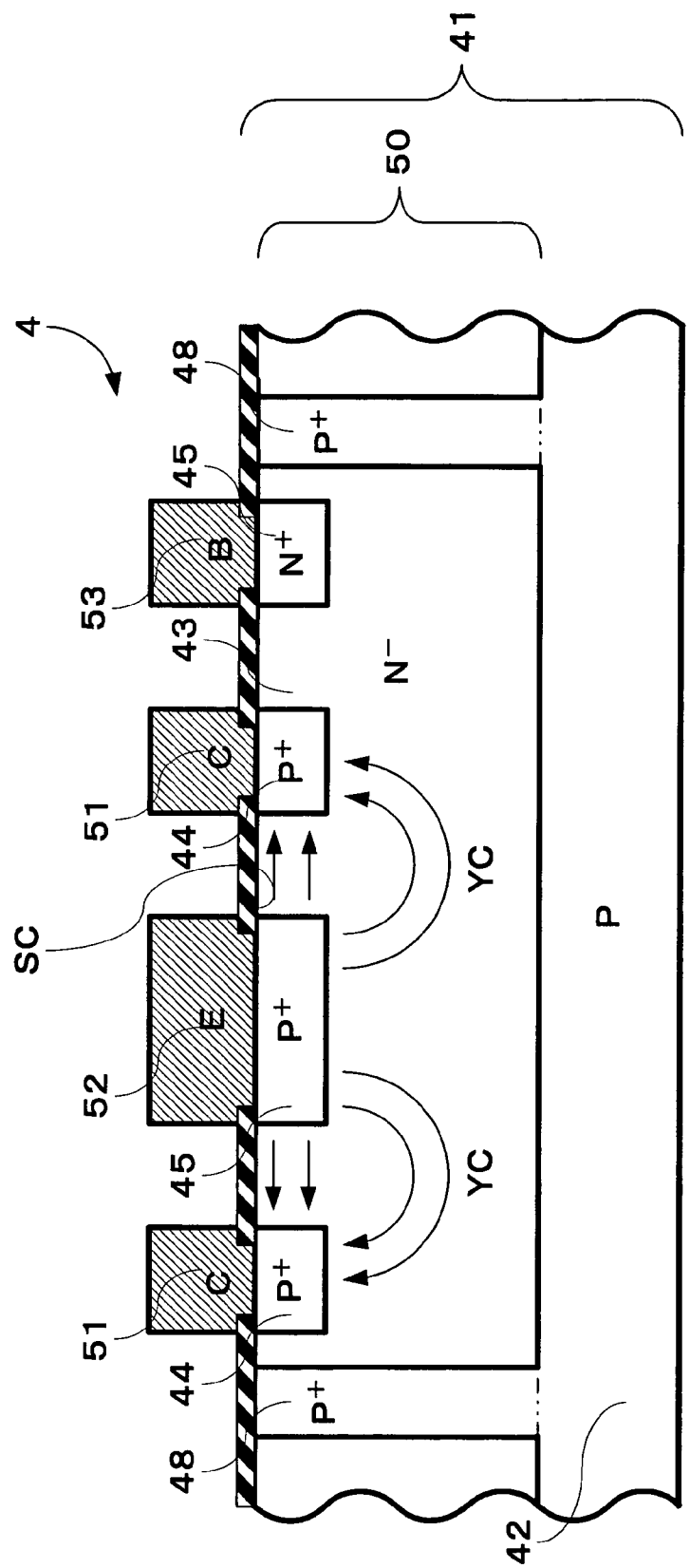
FIG. 9 is a cross-sectional view of a conventional semiconductor element that has a structure where the collector region surrounds the emitter region.

For example, as shown in FIG. 6, the rectifying region 17 does not have to contact the base contact region 16. In this way, even if the rectifying region 17 does not contact the base contact region 16, the same effects as above can be obtained, as long as the rectifying region 17 contacts the emitter region 15.

In the above embodiment, it is described that the rectifying region 17 has a higher impurity concentration than that of the base region 13. More concretely, it is preferable that the rectifying region 17 has an impurity concentration that is 1.5 to 10 times the impurity concentration of the base region 13. Also, it is described that the rectifying region 17 has a lower impurity concentration than that of the emitter region 15. Concretely, it is preferable that the rectifying region 17 has an impurity concentration that is $1/5$ to $1/15$ of the impurity concentration of the emitter region 15, if possible, $1/8$ to $1/12$ of the impurity concentration of the emitter region 15.

Above, an example where the N-type semiconductor layer 20 is formed by epitaxial growth, is shown. However, it is not limited to this, and the N-type semiconductor layer 20 may be formed by for example, introducing and diffusing an N-type impurity to the P-type semiconductor substrate 12.

In the above embodiment, an example where the rectifying region 17 is formed by the ion implantation method is shown. However, it is not limited to this, and the rectifying region 17 may be formed by for example, a thermal diffusion method, etc.

The semiconductor element 1 is not limited to a PNP transistor, and may be formed as a semiconductor element that is used in for example, an NPN transistor.

The manufacturing method of the semiconductor element 1 is not limited to the method described in the above embodiment. The order of the steps can be changed, and other steps can be added, if necessary.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2003-296848 filed on Aug. 20, 2003, and including specification, claims, drawings and summary. The disclosure of the above Japanese Patent Application is incorporated herein by reference in its entirety.

What is claimed is:

1. A semiconductor element comprising:
    a first semiconductor region of a first conductivity type;
    a second semiconductor region of a second conductivity type that contacts a side surface of the first semiconductor region, and is formed so as to surround the first semiconductor region;
    a third semiconductor region of the second conductivity type that is formed at a surface region of said first semiconductor region;
    a fourth semiconductor region of the first conductivity type that is formed at the surface region of the first semiconductor region, respectively separated a predetermined distance from the third semiconductor region, and has a higher impurity concentration than the impurity concentration of the first semiconductor region;
    a fifth semiconductor region of the second conductivity type that is formed at the surface region of the first semiconductor region, and is placed in between the third semiconductor region and the fourth semiconductor region, separated a predetermined distance from the third semiconductor region and the fourth semiconductor region;
    a sixth semiconductor region of the first conductivity type, having a higher impurity concentration than the impurity concentration of the first semiconductor region, that is formed at the surface region of the first semiconductor region, includes a region in between the fourth semiconductor region and the fifth semiconductor region, and is placed so as to contact the fifth semiconductor region;
    a first electrode that is electrically connected to the third semiconductor region;

a second electrode that is electrically connected to the fourth semiconductor region, and a third electrode that is electrically connected to the fifth semiconductor region.

2. The semiconductor element according to claim 1, wherein the sixth semiconductor region is formed deeper than the fourth semiconductor region and the fifth semiconductor region.

3. The semiconductor element according to claim 1, wherein the sixth semiconductor region is formed so as to straddle over the fourth semiconductor region and the fifth semiconductor region.

4. The semiconductor element according to claim 1, wherein the sixth semiconductor region is formed so as to cover a surface of the fifth semiconductor region that opposes the fourth semiconductor region.

5. The semiconductor element according to claim 4, wherein the sixth semiconductor region is formed so as to further cover at least a part of a surface of the fifth semiconductor region that opposes the second semiconductor region.

6. The semiconductor element according to claim 5, wherein the sixth semiconductor region has a lower impurity concentration than the impurity concentration of the fourth semiconductor region.

7. The semiconductor element according to claim 1, wherein the impurity concentration of the sixth semiconductor region is in a range of 1.5 to 10 times the impurity concentration of the first semiconductor region.

8. The semiconductor element according to claim 1, further comprising a semiconductor substrate of the second conductivity type, wherein the first semiconductor region and the second semiconductor region are formed on one surface of the semiconductor substrate.

9. The semiconductor element according to claim 1, wherein:

said first electrode is a collector electrode;

said second electrode is a base electrode;

said third electrode is an emitter electrode;

said third semiconductor region functions as a collector region;

said first semiconductor region and said fourth semiconductor region function as base regions, and said fifth semiconductor region functions as an emitter region.

* * * * *